United States Patent [19]

Zomorrodi

[11] Patent Number: 4,584,568

[45] Date of Patent: Apr. 22, 1986

[54] TWO-STEP SWITCHED-CAPACITOR DIGITAL TO ANALOG CONVERTER

[75] Inventor: Mehrdad Zomorrodi, Culver City, Calif.

[73] Assignee: Xerox Corporation, Stamford, Conn.

[21] Appl. No.: 623,889

[22] Filed: Jun. 25, 1984

[51] Int. Cl.⁴ .............................................. H03M 1/00
[52] U.S. Cl. ......................... 340/347 DA; 340/347 M
[58] Field of Search .................................. 340/347 DA

[56] References Cited

U.S. PATENT DOCUMENTS

| | | | |
|---|---|---|---|
| 4,412,208 | 10/1983 | Akazawa et al. | 340/347 DA |
| 4,451,820 | 5/1984 | Kapral | 340/347 DA |
| 4,468,654 | 8/1984 | Kapral | 340/347 DA |

OTHER PUBLICATIONS

Yee, Terman and Heller, IEEE Journal of Solid State Circuits, Aug. 1979, vol. SC-4, No. 4, pp. 778-781.
Dooley, 1973 IEEE International Solid State Circuits Conference, Digest of Technical Papers, pp. 12-13.
Stellrecht and Kelson, 1973 IEEE International Solid State Circuits Conference, Digest of Technical Papers, pp. 16-17.

Primary Examiner—William M. Shoop, Jr.
Assistant Examiner—Sharon D. Logan
Attorney, Agent, or Firm—Franklyn C. Weiss

[57] ABSTRACT

In accordance with the present invention, the circuitry of the ten bit switched capacitor digital to analog converter utilizes five binary weighted input capacitors and a digital circuit to perform multiplexing and generating the necessary timing. A combination of input capacitors and feedback capacitors give rise to an output voltage in an amount proportional to digital input bits in a binary fashion such that in the first step, the output voltage is proportional to the first five least significant bits divided by 32 and the second step the output voltage would be equal to the previous value plus a voltage proportional to the five most significant bits. Therefore, at the end of the second step, the output voltage is an analog voltage proportional to the binary input bits times the reference voltage divided by 1024.

6 Claims, 3 Drawing Figures

TWO-STEP SWITCHED-CAPACITOR DIGITAL TO ANALOG CONVERTER

This invention relates to a high speed, parasitic insensitive, ten bit plus sign, two step, switched capacitor, digital to analog converter. By utilizing an array of capacitors in the two step process, a minimum number of conversion capacitors are utilized.

BACKGROUND OF THE INVENTION

Most conventional techniques for digital to analog conversion require both high performance of analog circuitry, such as opertional amplifiers, and digital circuitry for counting, sequencing, and data storage. This has tended to result in hydrid circuits consisting of one or more bi-polar analog integrated circuit chips and an MOS chip to perform the digital functions. High performance and fairly complex signal processing has recently become possible on a single monolithic chip due to the face that very accurate capacitor ratios could be obtained in MOS technology to replace cumbersome conventional techniques such as diffused resistors, complex thin film process or ion implanted resistors. Using switched capacitor circuits reduces cost and power consumption significantly. The major problem with existing switched capacitor digital to analog converters is that all these circuits are sensitive to parasitic capacitances associated with the main capacitors of the circuit and are therefore incapable of delivering high resolution of ten bit accuracy and maintaining their monotonic characteristic. Another problem with existing circuits is that the area of silicon occupied by capacitors increases exponentially as a function of the number of input bits. To date, it has so far been impossible to get enough accuracy for ten bit resolution with reasonable silicon area. Lastly, the third major problem associated with existing digital to analog converters (DACs) is that the limiting factor on the conversion rate is always dictated by the current to voltage converting amplifier.

The circuit disclosed herein combines several new techniques to overcome the above mentioned problems. This new digital to analog converter is designed such that it is completely insensitive to parasitic capacitors associated with both plates of each capacitor which exists in the circuit so that very high resolution could be obtained. Secondly, a new variable gain technique, which could be defined as analog shift and add circuit, has been utilized to reduce the total capacitance needed for a ten bit DAC from 1025 unit capacitors to 63 unit capacitors. Finally, the circuit has been designed in such a way that a voltage mode output is available from the chip at the same speed that conversion actually happens. Therefore, there is no need for off chip amplification which limits speed.

In accordance with the present invention, the circuitry of the switched capacitor digital to analog converter utilizes five binary weighted input capacitors and a digital circuit to perform multiplexing and generating the necessary timing. A combination of input capacitors and feedback capacitors gives rise to an output voltage in an amount proportional to digital input bits in a binary fashion such that in the first step, the output voltage is proportional to the first five least significant bits divided by 32 and the second step the output voltage would be equal to the previous value plus a voltage proportional to the five most significant bits again divided by 32. Therefore, at the end of the second step, the output voltage is an analog voltage proportional to the binary input bits times the reference voltage divided by 1024.

DESCRIPTION OF THE DRAWINGS

For a more complete understanding of the invention, reference may be had to the following detailed description of the invention in conjunction with the drawings wherein.

DETAILED DESCRIPTION OF THE INVENTION

In certain circuit applications, like for a type one ink yet, 1024 output voltages are needed in response to input digital signals. Further, ten bit accuracy is desired in order to implement the 1024 output analog voltages. Prior art capacitive integrated circuits utilizing 1025 unit capacitors require a lot of area on an integrated circuit chip and some ink jet circuits require approximately 200 of these digital to analog converters for one machine, such voltage generation can be very costly due to the number of digital to analog converters (DACs) for one machine. Thus, it is extremely desirable to decrease the size of the capacitors and the number of capacitors on a single integrated circuit chip.

Prior art DACs utilize resitors, but they cannot meet the requirement of ten bit resolution unless a large amount of power and integrated circuit area are utilized.

Modern integrated circuit technology allows the very accurate ratio of capacitor circuit generation on a single integrated circuit chip. Thus, high accuracy generation of capacitor ratios can provide for the required ten bit resolution accuracy. The present invention reduces the number of unit capacitors required from 1025 to 63 unit capacitors and still accomplishes ten bit accuracy. The various capacitor combinations on the chip in the required circuit are actually multiples of unit capacitors as fabricated on the integrated circuit chip. If a value of 2C is required, then two capacitors are wired in parallel. If a value of 4C is required, then four of the unit capacitors are wired in parallel right on the integrated circuit chip.

Figure 1:
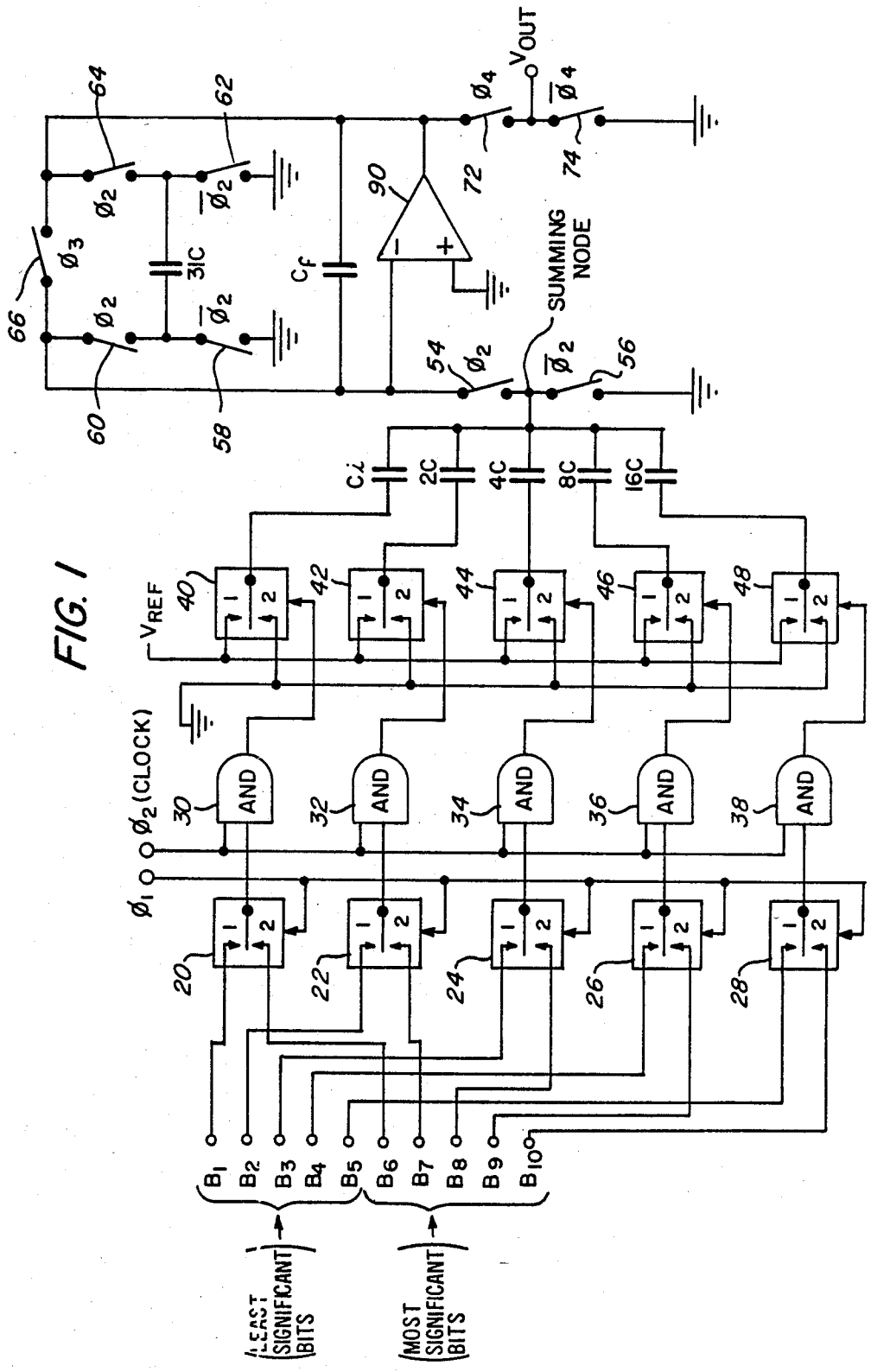
FIG. 1 is a schematic diagram of a ten bit switched capacitor digital to analog converter in accordance with the principles of the present invention.
Figure 2:
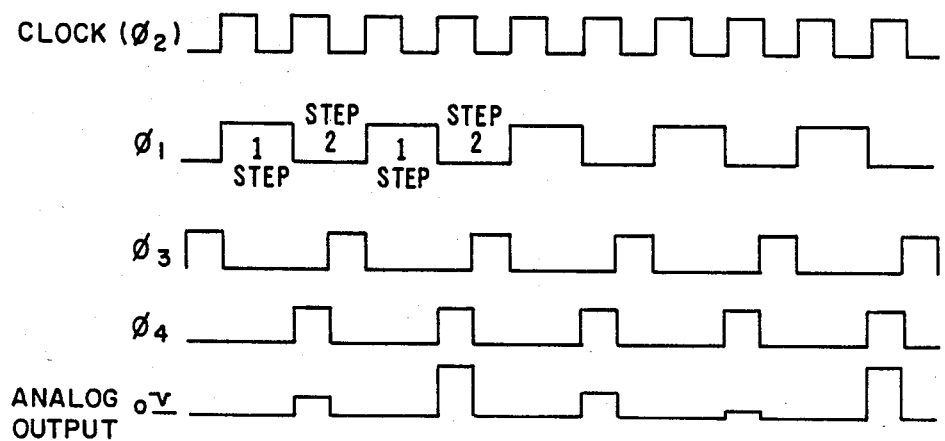
FIG. 2 are clock signals helpful in understanding the operation of FIG. 1.

FIG. 1 of the present application shows a ten bit switched capacitor digital to analog converter utilizing the principles of the present invention. The values of 'C' (unit capacitors) as seen on the right hand part of the figure are all unit capacitors wired either singly or in parallel depending upon the capacitor ratio set forth therein. To the left of the figure are inputs for the digital word comprising ten different discrete digital bits. Bits B1 through B5 comprise the least significant bits, while bits B6 through B10 comprise the most significant bits which will be described hereinafter in accordance with the principles of the present invention. With ten digital input signals, 1024 different digital combinations of input digits are possible. The binary number 2 raised to the ten power is 1024 possible output voltages, which could be generated by the circuit set forth in FIG. 1.

Besides the reduced size and cost of the present digital to analog converter, another major advantage of the present invention over conventionally available circuits is that this digital to analog converter generates output voltge rather than output current. Most available digital to analog converters generate output current which then require a current to voltage converter to get the desired output voltage. In ink jet situations, it is required to charge a discrete ink drop to a specific voltage and thus the present circuit eliminates any need for a current to voltage converter because the output signal are in fact discrete voltage levels.

The conversion time of one set of digital inputs to the present circuit to generate one level of voltage at the output should take between one to two microseconds, with a maximum of two microseconds. The limiting factor of the digital to analog converter of the present invention is amplifier 90, which is an operational amplifier, but in actual fabrication is a one-stage, single ended input/single ended output cascode amplifier, with the cascode amplifier providing very high speed and reducing the parasitic effects of the input capacitance to the amplifier 90.

The voltage conversion is carried out in two steps. Each step has two clock phases, and with two steps, there are four clock phases, $\phi 1$, $\phi 2$, $\phi 3$, and $\phi 4$. The first step utilizes the input digits of the input binary word B1 through B5 and multiplexes it later with the voltage generated in response to digital input digits B6 through B10. In the first step, the gain is 1/32 of the second step. That is, when the five least significant bits in the input digital signal are applied to the circuit, the voltage generated at the output corresponds to these five least significant bits and then is divided by 32, stored, then added to the voltge generated which is corresponding to the five most significant bits applied to terminals B6 through B10 and again divided by 32. So if the voltage generated by the five least significant bits, then divided by 32, is added to the output voltage in response to the five most significant bits and again divided by 32, the output is the voltage level in response to the digital signal applied to terminals B1 through B10, multipled by reference voltage divided by 1024.

Another advantage of the present circuit is that it accomplishes high speed and high resolution with low cost and low power consumption because the power consumption of a capacitor is almost zero. The only part of the circuit that unless significant power is the amplifier 90. The present circuit uses much less power than a regular R-2R ladder network DAC, bi-polar DAC, resistive DAC, or resistive bipolar DAC. Thus, the only time the present circuit uses power is during the charge and discharge cycle of the capacitors. In addition, the switched capacitor DAC circuit is fully parasitic insensitive to parasitic capacitances between each plate of the main capacitor to the substrate. Normally a capacitor has parasitics on each plate with respect to the substrate, which affect the charge distribution in a circuit. However, the present circuit is completely parasitic insensitive in that each plate of the main capacitors is either switched between ground and a low impedance voltage source with the result that parasitic capacitances are not seen by the circuit.

The circuit operates as based on the four phases of the clock signal $\phi 1$, $\phi 2$, $\phi 3$ and $\phi 4$ is the time that the output is valid, that is, presented to subsequent circuitry. This is because the output voltage is not accurate during the first two steps of the operation of the circuit as hereinbefore set forth. $\phi 2$ is the clock cycle of the digital to analog converter circuit herein as would be supplied by any external clock. Every two cycles of the $\phi 2$ clock phase would be one conversion from the digital to analog voltage. Thus, one, conversion happens in two steps and one step is one clock cycle of $\phi 2$. The only place that $\phi 2$ is present is at the input to the AND gates 30 to 38. $\phi 2$ enables the inputs to the AND gates so that when $\phi 2$ is a logic one the AND gates are enabled and when $\phi 2$ is a logic 0, the AND gates are disabled. The input terminals representing the least significant and most significant bits B1 to B10 are coupled to the inputs of multiplexer switches 20 to 28. The least significant bits B1 to B5 are coupled to the terminals designated 1 on all the multiplexer switches 20 to 28. The most significant input digits B6 through B10 are connected to the terminals designated 2 on the multiplexer switches 20 to 28. Thus, when the schematic switch arms are in the designated 1 position, the least significant bits B1 through B5, wheter logic 1 or logic 0, would be presented to the inputs to AND gates 30 to 38. When the schematic switch arms on multiplexer switches 20 to 28 are in the designated 2 position, the binary digits of the most significant bits B6 through B10 are presented to the inputs to AND gates 30 to 38, wheter logic 1 or logic 0. $\phi 1$ phase clock is one-half the frequency of the $\phi 2$ phase clock and when $\phi 1$ clock is a logic 1 or the high position, the multiplexer switches 20 to 28 would be in the designated 1 positions. This, as set forth above, would allow the least significant bits B1 through B5 to be presented to the AND gates 30 through 38. Assuming, for purposes of example, that the $\phi 1$ clock is in the logic 1 position, all the multiplexer switches 20 to 28 would be enabled through their enable inputs to be in the designated 1 position. When the phase 2 clock is also in the up or logic 1 state, then the AND gate is enabled and whatever digital value was presented on input terminals B1 through B5 would now be presented to the enable inputs of multiplexer switches 40 through 48. Any logic 1 in the input digits B1 through B5 would cause specific ones of the multiplexers 48 to assume the designated 1 position as seen in FIG. 1. With the center arm in the 1 position, the voltage Vref would then be applied through the specific multiplexer switch 40 through 48 to the capacitors Ci, 2C, 4C, 8C, or 16C, respectively.

Depending upon which capacitors have charge applied to their inputs, because the other uncharged capacitors would be connected to ground potential through terminals 2 of multiplexer switches 40 to 48, a predetermined amount of charge will be presented to the remainder of the circuit. Because $\phi 2$ clock signal is now enabled, switch 54 would be closed while switch 56 would be open. Switch 56 would be closed during the logic 0 cycle of the $\phi 2$ clock signal thus discharging all the capacitors Ci through 16C. Again, because $\phi 2$ clock signal is now in the up position for this present example, switches 60 and 64 would be closed while switches 58, 62 and 66 would be open, thus rendering value 31C to be in parallel across a capacitor Cf across the input to operational amplifier 90. The operation of capacitor 31C across capacitor Cf which is across operational amplifier 90, causes the output from amplifier 90 to be 1/32 of the value that would normally be present there without the existence of capacitor 31C. When $\phi 1$ phase clock signal returns to the logic 0 or down state, the schematic connector arms of multiplexer switches 20 to 28 return to the designated 2 positions from the designated 1 positions thus now coupling the inputs of the most significant bits B6 through B10 to the inputs of AND gates 30 through 38. Now the binary digits of the most significant bits B6 through B10 are now presented to the inputs of AND gates 30 to 38, then to the enable inputs to multiplexer switches 40 to 48 as were the least significant bits B1 through B5 described above. Before $\phi2$ clock signal enabled AND gates 30 to 38 during the second step of the operation of this amplifier, the logic 0 or down state of clock signal $\phi2$ had closed switch 56 thus discharging the charge of capacitors Ci to 16C to ground. It did not affect the value of capacitor Cf as much as when switch 56 closed, switch 54 opened. Similarly, switch 58 closed when switch 60 opened and when switch 62 closed, 64 opened, thus discharging the value of capacitor 31C to ground, but not affecting the value of capacitor Cf. Thus, the most significant bits now charge capacitors Ci through 16C selectively, depending upon the digital values of bits B6 through B10, which now present charge again to the input of amplifier 90. Now, the charge on capacitor Cf, the only feedback capacitor across amplifier 90, and the voltage stored before due to the inputs B1 through B5 are now added to the value of the charge from capacitors Ci to 16C as now presented to the output of the circuit. After the capacitor Cf has been charged by both the least significant bits and the most significant bits, switch 72 closes and switch 74 opens thereby allowing the voltage amplified by amplifier 90 to be presented to subsequent circuitry. This signal would be one of 1024 voltage levels as hereinabove fully set forth.

Thus, it can be seen that the switched capacitor digital to analog converter works in two steps with bits B1 through B5 operating to generate a first charge across capacitor Cf while bits B6 through B10 operate in a second step to increase the charge value upon capacitor Cf to generate the discrete output voltages. The more logic ones in the binary inputs B1 through B10, the higher the voltage that would appear across the output of amplifier 90. For example, if you have all binary one inputs you get the maximum capacitance at the input capacitance Ci to 16C providing more charge to feedback capacitor Cf across the input and output of amplifier 90. The operation of capacitor 31C operates to discharge to ground when switches 58 and 62 are operated in the not $\phi2$ state, to substract value of charge 31C from capacitor Cf. By subtracting the voltage charge of 31C from capacitor Cf, the value of charge is, in effect, being divided by 32. Then, the most significant bits are applied to the circuit, the charge being generated by amplifier 90 being added to the remaining charge on capacitor Cf to generate the output voltage signal. Clock signal $\phi3$ operates at the end of the clock cycles of phase $\phi2$ and at the end of the one cycle of clock $\phi1$, to reset the amplifier 90 by discharging the value across capacitor Cf. $\phi3$ phase clock only occurs at the end of the two step conversion cycle, not at the end of the first step, so that the system is reset only at the end of the full two step conversion cycle.

Typical reference voltge Vref would be 10 volts with the output voltage ranging from 0 to 10 volts in 1024 steps with each step being in ten millivolt increments. The multiplexer switches shown to be actual switches schematically on the figure, would actually be metal oxide semiconductor (MOS) switches not physical switches as shown in the figure. Similarly, switches 54 et seq, are not real switches but are transistorized switches as would appear on an integrated circuit chip.

FIG. 2A to 2F show the various clock phases $\phi2$, $\phi1$, $\phi3$, $\phi4$ and the output voltge as described above in conjunction with FIG. 1. It can be seen that clock phase $\phi2$ is twice the frequency of clock phase $\phi1$ with two clock cycles per conversion for clock phase $\phi2$ and one conversion for one cycle in clock phase $\phi1$. Clock phase $\phi3$ occurs at the end of the second half of clock phase 1 to discharge all the feedback capacitors and phase clock $\phi4$ only appears at the beginning of the second half of the cycle of phase $\phi1$ to allow the output analog voltage to be presented to the output of the circuit.

Figure 3:
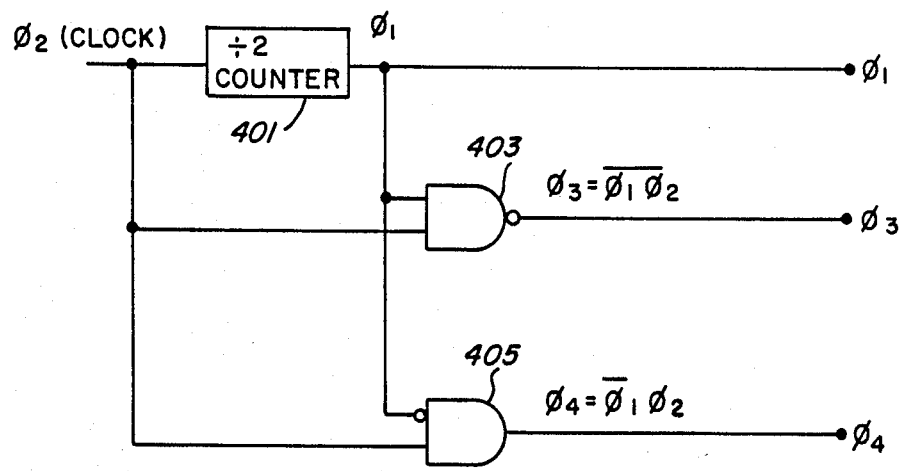
FIG. 3 is a schematic diagram of a clock circuit necessary for generating the clock signals in FIG. 2.

FIG. 3 shows the input clock phase $\phi2$ being divided by divide counter 401 which generates the clock phase signal $\phi1$. NAND gate 403 provides the clock phase signal 03 in response to input clock phases $\phi1$ and $\phi2$. Inhibitor circuit 405 only provides an output clock phase signal $\phi4$ whenever the inputs to the circuit are different such as when clock phase signal $\phi2$ is high and clock phase signal $\phi1$ is low.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A switched capacitor, digital to analog signal converter, wherein said digital signal comprises a binary word of a predetermined number of bits, comprising:
   a first plurality of switch means (20-28) for receiving and transferring the input digital signals, said first switch means being switchable between first and second positions for transferring the least significant bits of said input digital signal in the first position and for transferring the most significant bits of said input digital signal in the second position,
   a second plurality (40-48) of switch means coupled to said first plurality of switch means for selectively transferring either a first voltage reference level or a second voltage reference level in response to said input digital signal,
   a first plurality of unit capacitor means (C-16C) connected to form a parallel array of capacitors, each one of said parallel array being connected to a different one of said second plurality of switch means and being charged either to said first voltage reference level or said second voltage level, the charges on said array of capacitors being summed,
   amplifier means (90) coupled to said plurality of unit capacitors for amplifying and converting said charge to said analog signal,
   a second plurality of unit capacitors connected together and to the input and output of said amplifier means in parallel; and
   second plurality of switch means selectively placed in said second plurality of unit capacitors to cause one combination of capacitors to be placed across said amplifier means when said least significant bits are being converted and another combination of capacitors to be placed across said amplifier means when said most significant bits are being converted.

2. The digital to analog converter as set forth in claim 1 further including:
   first means for generating a first phase signal (01) to cause said first plurality of switch means to switch to the first position and then the second position;

second means for generating a second phase signal (02), and a first plurality of gate means (30-38) connected between said first plurality of switch means and said second plurality of gate means to present said most or least significant bits to said second plurality of gate means at a clock phase generated by said second generating means.

3. The digital to analog converter as set forth in claim 2 further including:

a third plurality of switch means between said first plurality of unit capacitor means and the input to said amplifier means to selectively discharge said first plurality of unit capacitor means or transfer the charge stored on said first plurality of unit capacitor means.

4. The digital to analog converter as set forth in claim 1 or 3, wherein said second plurality of unit capacitors and said second plurality of switch means further comprises:

a first capacitor means (Cf) in parallel across said amplifier means, said capacitor means having a first electrode means coupled to the input of said amplifier means, and a second electrode means connected to the output of said amplifier means, a second capacitor means (31c) having first and second electrode means, said first electrode means being coupled via a first switch means (60) to the first electrode means of said first capacitor means (Cf) or being coupled via a second switch means (58) to ground potential, said second electrode means being coupled via a third switch means (64) to said second electrode means of said first capacitor means, or being connected via a fourth switch means (62) to ground potential, and a fifth switch means (66) coupled to said first and second electrode means of said first capacitor means (Cf), such that said second capacitor means (31c) operates to subtract the value of charge thereon from the charge on said first capacitor means (Cf).

5. A switched capacitor digital signal to analog signal converter comprising:

means for selectively transferring the least significant or most significant digits in said digital signal, a plurality of unit capacitor means coupled to said selectively transferring means for storing the charge representing the binary number of said digital signal, each of said plurality of unit capacitor means comprising various predetermined sets of unit capacitors joined together in parallel to form different values of capacitance, amplifier means coupled to said plurality of unit capacitor means for amplifying the charge representing the input digital signal, a second plurality of unit capacitor means coupled across the input and output of said amplifier means for altering the feedback capacitance thereto depending on whether the least significant or most significant binary digits in said digital signal are at that time progressing through the converter.

6. The switched capacitor digital signal to analog signal converter as set forth in claim 5 further including means for adding the charge generated and amplified for the least significant digits to the charge generated and amplified for the most significant digits.

* * * * *